US011630436B2

(12) United States Patent
Abe et al.

(10) Patent No.: US 11,630,436 B2
(45) Date of Patent: Apr. 18, 2023

(54) MEASUREMENT PROGRAM SELECTION ASSISTING APPARATUS AND MEASUREMENT CONTROL APPARATUS

(71) Applicant: Mitutoyo Corporation, Kanagawa (JP)

(72) Inventors: Shinsaku Abe, Hokkaido (JP); Kuniyuki Nuka, Tokyo (JP)

(73) Assignee: MITUTOYO CORPORATION, Kawasaki (JP)

( * ) Notice: Subject to any disclaimer, the term of this patent is extended or adjusted under 35 U.S.C. 154(b) by 673 days.

(21) Appl. No.: 16/655,455

(22) Filed: Oct. 17, 2019

(65) Prior Publication Data
US 2020/0125066 A1    Apr. 23, 2020

(30) Foreign Application Priority Data

Oct. 22, 2018  (JP) .............................. JP2018-198296
May 27, 2019  (JP) .............................. JP2019-098436

(51) Int. Cl.
*G05B 19/4069*    (2006.01)
*G06T 19/00*    (2011.01)
(Continued)

(52) U.S. Cl.
CPC ..... *G05B 19/4069* (2013.01); *G06F 3/04817* (2013.01); *G06F 30/20* (2020.01);
(Continued)

(58) Field of Classification Search
CPC ...... G05B 19/4069; G05B 2219/32014; G06T 7/579; G06T 7/73; G06T 19/006;
(Continued)

(56) References Cited

U.S. PATENT DOCUMENTS 6,816,609 B1    11/2004  Shimizu et al.
7,724,380 B2    5/2010   Horita et al.
(Continued)

FOREIGN PATENT DOCUMENTS

JP    2001-59708    3/2001
JP    2001-319219   11/2001
(Continued)

OTHER PUBLICATIONS

Sekine, M., Sugita, K., Perbet, F., Stenger, B., Nishiyama, M.: Virtual fitting by single-shot body shape estimation. In: Int. Conf. on 3D Body Scanning Technologies. pp. 406-413. Citeseer (2014).*
(Continued)

*Primary Examiner* — Jin Ge
(74) *Attorney, Agent, or Firm* — Rankin, Hill & Clark LLP

(57) ABSTRACT

The present invention provides a measurement program selection assisting apparatus capable of visually confirming whether a selected measurement program is suitable for an object to be measured. One aspect of the present invention is a measurement program selection assisting apparatus comprising: a measurement program database storing a measurement program related to measurement of an object and superimposed display information corresponding to a three-dimensional shape of the object in association with each other; a display unit capable of displaying information defined in a virtual space superimposed on the real space; and a display control unit for acquiring the superimposed display information corresponding to a selected measurement program from the measurement program database and displaying the acquired superimposed display information in a mixed reality on the display unit.

4 Claims, 11 Drawing Sheets

(51) Int. Cl.
*G06T 7/00* (2017.01)
*G06T 7/73* (2017.01)
*G06T 7/579* (2017.01)
*G06F 3/04817* (2022.01)
*G06F 30/20* (2020.01)
*G06V 10/20* (2022.01)
*G06V 20/20* (2022.01)
*G06V 20/64* (2022.01)

(52) U.S. Cl.
CPC ............ *G06T 7/0006* (2013.01); *G06T 7/579* (2017.01); *G06T 7/73* (2017.01); *G06T 19/006* (2013.01); *G06V 10/255* (2022.01); *G06V 20/20* (2022.01); *G06V 20/64* (2022.01); *G05B 2219/32014* (2013.01); *G06V 2201/06* (2022.01)

(58) Field of Classification Search
CPC ... G06T 7/0006; G06F 30/20; G06F 3/04817; G06V 20/20; G06V 20/64; G06V 10/255; G06V 2201/06
USPC ............................................................ 703/7
See application file for complete search history.

(56) References Cited

U.S. PATENT DOCUMENTS

| | | | |
|---|---|---|---|
| 2001/0040995 | A1 | 11/2001 | Takada et al. |
| 2006/0269123 | A1* | 11/2006 | Horita ..................... G06T 7/579 382/154 |
| 2015/0049186 | A1* | 2/2015 | Pettersson ............ G05B 19/401 348/135 |
| 2015/0211847 | A1* | 7/2015 | Abe ........................ G01B 21/04 33/503 |
| 2020/0337789 | A1* | 10/2020 | Meglan ................ G09B 23/285 |

FOREIGN PATENT DOCUMENTS

| | | | |
|---|---|---|---|
| JP | 2002-156222 | 5/2002 | |
| JP | 2006-329903 | 12/2006 | |
| JP | 2016-205974 | 12/2016 | |
| JP | 2016205974 | * 12/2016 | ............ G01B 21/00 |
| JP | 2018-004362 | 1/2018 | |

OTHER PUBLICATIONS

Japanese Office Action dated Mar. 8, 2022, English translation included, 8 pages.

* cited by examiner

MEASUREMENT PROGRAM SELECTION ASSISTING APPARATUS AND MEASUREMENT CONTROL APPARATUS

CROSS-REFERENCE TO RELATED APPLICATION

This non-provisional application claims priority under 35 U.S.C. § 119(a) from Japanese Patent Application No. 2018-198296, filed on Oct. 22, 2018, and Japanese Patent Application No. 2019-98436, filed on May 27, 2019, the entire contents of which are incorporated herein by reference.

BACKGROUND

Technical Field

The present invention relates to a measurement program selection assisting apparatus, and more particularly, to a measurement program selection assisting apparatus for enabling selection of a measurement program suitable for an object to be measured by a measuring apparatus.

Background Art

In a measuring apparatus such as a three-dimensional measuring apparatus, a function of performing automatic measurement using a measurement program (part program) storing a measurement procedure is provided. Japanese Patent Application Laid-Open No. 2001-059708 discloses an image measuring apparatus capable of efficiently measuring a plurality of workpieces by a simple operation using a measurement program.

Japanese Patent Application Laid-Open No. 2001-319219 discloses a part program generating apparatus which is easy for an operator to use and which can efficiently generate a part program for a CNC image measuring apparatus without complicated operations.

In addition, when measuring a workpiece using a part program in a measuring apparatus such as a three-dimensional measuring apparatus, it is necessary to select a part program suitable for the workpiece. Japanese Patent Application Laid-Open No. 2018-004362 discloses a part program selecting apparatus having a simple configuration and capable of selecting an optimum part program for a workpiece.

SUMMARY OF THE INVENTION

Problems to be Solved by the Invention

However, at present, it is not easy to confirm whether the selected measurement program is truly suitable for the object to be measured. For example, when there are a plurality of objects having similar shapes, it is particularly difficult to confirm the suitability. In addition, a jig is attached to the object to be measured, and measurement is often performed. At this time, if the method of attaching the jig to the object is erroneous, the measurement path and the measurement location may differ from the expected even though an appropriate measurement program for the object is selected, and an accident such as a collision may occur.

It is an object of the present invention to provide a measurement program selection assisting apparatus capable of visually confirming whether a selected measurement program is suitable for an object to be measured.

Means for Solving the Problems

One aspect of the present invention is a measurement program selection assisting apparatus comprising: a measurement program database storing a measurement program related to measurement of an object and superimposed display information corresponding to a three-dimensional shape of the object in association with each other; a display unit capable of displaying information defined in a virtual space superimposed on the real space; and a display control unit for acquiring the superimposed display information corresponding to a selected measurement program from the measurement program database and displaying the acquired superimposed display information in a mixed reality on the display unit.

According to such a configuration, superimposed display information (e.g., a three-dimensional model or a measurement path) corresponding to the three-dimensional shape of the object to be measured is stored in the measurement program database, and the superimposed display information corresponding to the selected measurement program is superimposed on the real space and displayed in a mixed reality. The operator can visually determine whether or not the selected measurement program is suitable for the measurement of the object by referring to the mixed reality display displayed on the display unit.

In the measurement program selection assisting apparatus described above, the measurement program database may store the three-dimensional shape of the object in association with the measurement program of the object. The measurement program selection assisting apparatus may further comprise: a detecting unit for recognizing the shape of the object; and a measurement program specifying unit for specifying the measurement program corresponding to the object by referring the shape of the object recognized by the detecting unit to the measurement program database. The display control unit may set the measurement program specified by the measurement program specifying unit as the selected measurement program. With this configuration, the measurement program corresponding to the object can be specified based on the shape of the object recognized by the detecting unit.

In the measurement program selection assisting apparatus described above, the detecting unit may acquire the position and orientation of the object, and the measurement program database may store arrangement information for measurement indicating a position and an orientation of the object suitable for measuring the object by the measurement program in association with the measurement program of the object. The measurement program selection assisting apparatus may further comprise measurement program correcting unit for calculating an error of the position and orientation of the object acquired by the detecting unit from the arrangement information for measurement corresponding to the measurement program specified by the measurement program specifying unit, and correcting the coordinates specified in the measurement program so as to be shifted by the error. With this configuration, the position and orientation of the object can be acquired by the detecting unit, and the deviation (error) between the acquired position and orientation of the object and the position and orientation of the object defined in the specified measurement program corresponding to the object can be corrected.

The measurement program selection assisting apparatus may further include operation input unit for accepting an operation for designating a measurement target position on the object. The measurement program database may store the measurement program for measuring the measurement target position of the object and the superimposed display information corresponding to the three-dimensional shape of the measurement target position in association with each other. With this configuration, it is possible to store the measurement target position accepted by the operation input unit in association with the measurement program and the superimposed display information.

In the measurement program selection assisting apparatus, the display control unit may display information indicating past measurement results of the object superimposed on the object. As a result, the operator can perform the measurement while referring to the past measurement results of the object displayed on the display unit.

The measurement control apparatus according to the present invention includes: a control unit that executes a selected measurement program to cause a measuring apparatus to perform measurement of an object; a display unit capable of displaying information defined in a virtual space superimposed on the real space; and a display control unit that causes the display unit to display, as the superimposed display information, a motion prediction display indicating the motion of the measuring apparatus when the selected measuring program is executed.

In the measurement control apparatus, the motion prediction display may include a three-dimensional moving image. The motion prediction display may include a graphic showing the moving path of the probe included in the measuring apparatus. With such motion prediction display, the operator can visually recognize the possibility of interference when the measurement program is executed.

The measurement control apparatus may further comprise detecting unit for acquiring the shape, position and orientation of the object. Then, based on the shape of the object acquired by the detecting unit and the selected measurement program, the control unit may evaluate the possibility of interference between the object and the measuring apparatus when the measurement program is executed, and the display control unit may cause the display unit to display where the possibility of interference occurs is more than a predetermined value as the superimposed display information in mixed reality.

The measurement control apparatus may further include a field of view specifying unit for specifying the field of view of the operator. The control unit may control the movement of the measuring apparatus based on the measurement program so as not to start unless the superimposed display information falls within the field of view of the operator specified by the field of view specifying unit. With this configuration, it is possible to prevent the operator from forgetting to visually confirm the superimposed display information.

DETAILED DESCRIPTION OF THE EMBODIMENTS

First Embodiment

Figure 1:
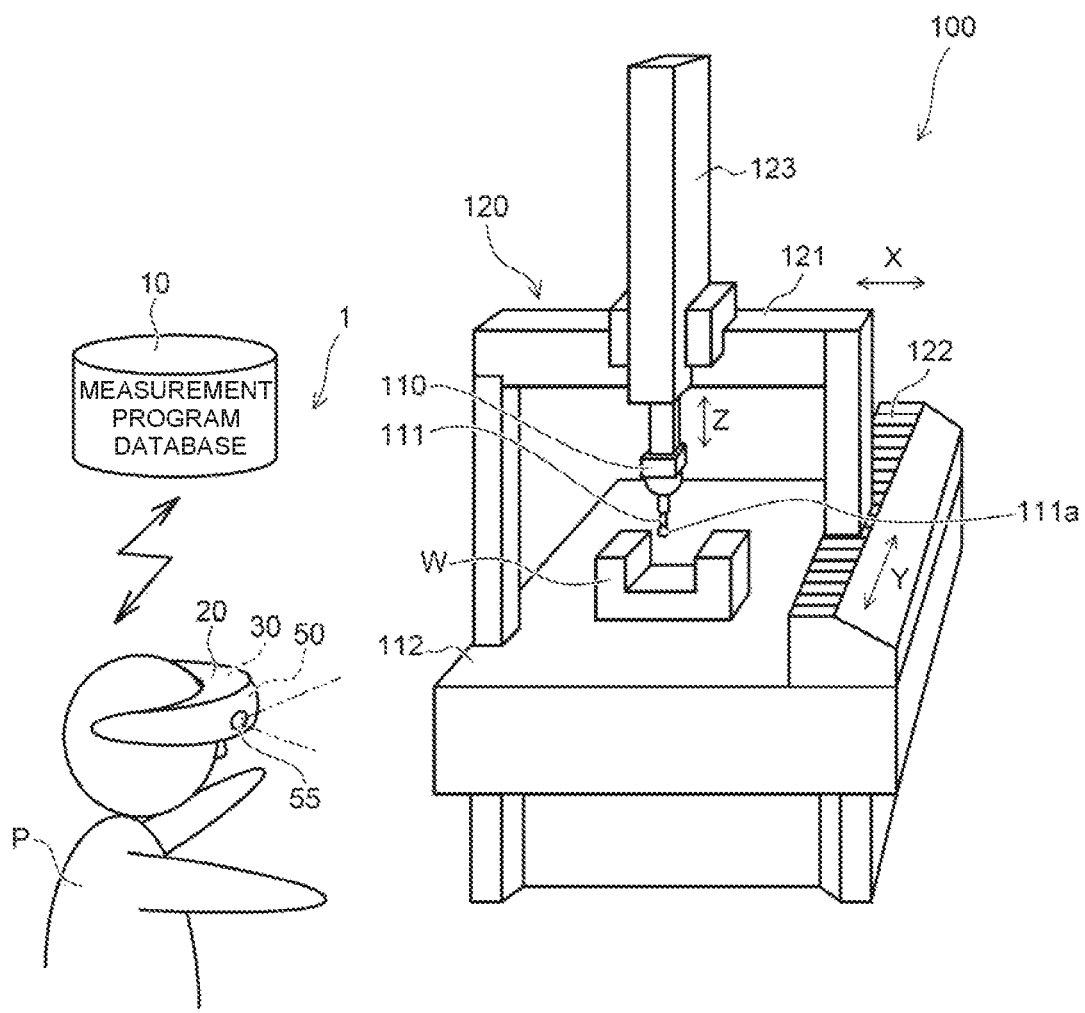
FIG. 1 is a schematic diagram illustrating a configuration of a measurement program selection assisting apparatus according to the first embodiment.

Hereinafter, a first embodiment of the present invention will be described with reference to the drawings. In the following description, the same members are denoted by the same reference numerals, and the description of the members once described is appropriately omitted.

[Configuration of Measurement Program Selection Assisting Apparatus]

FIG. 1 is a schematic diagram illustrating a configuration of a measurement program selection assisting apparatus according to the present embodiment.

Figure 2:
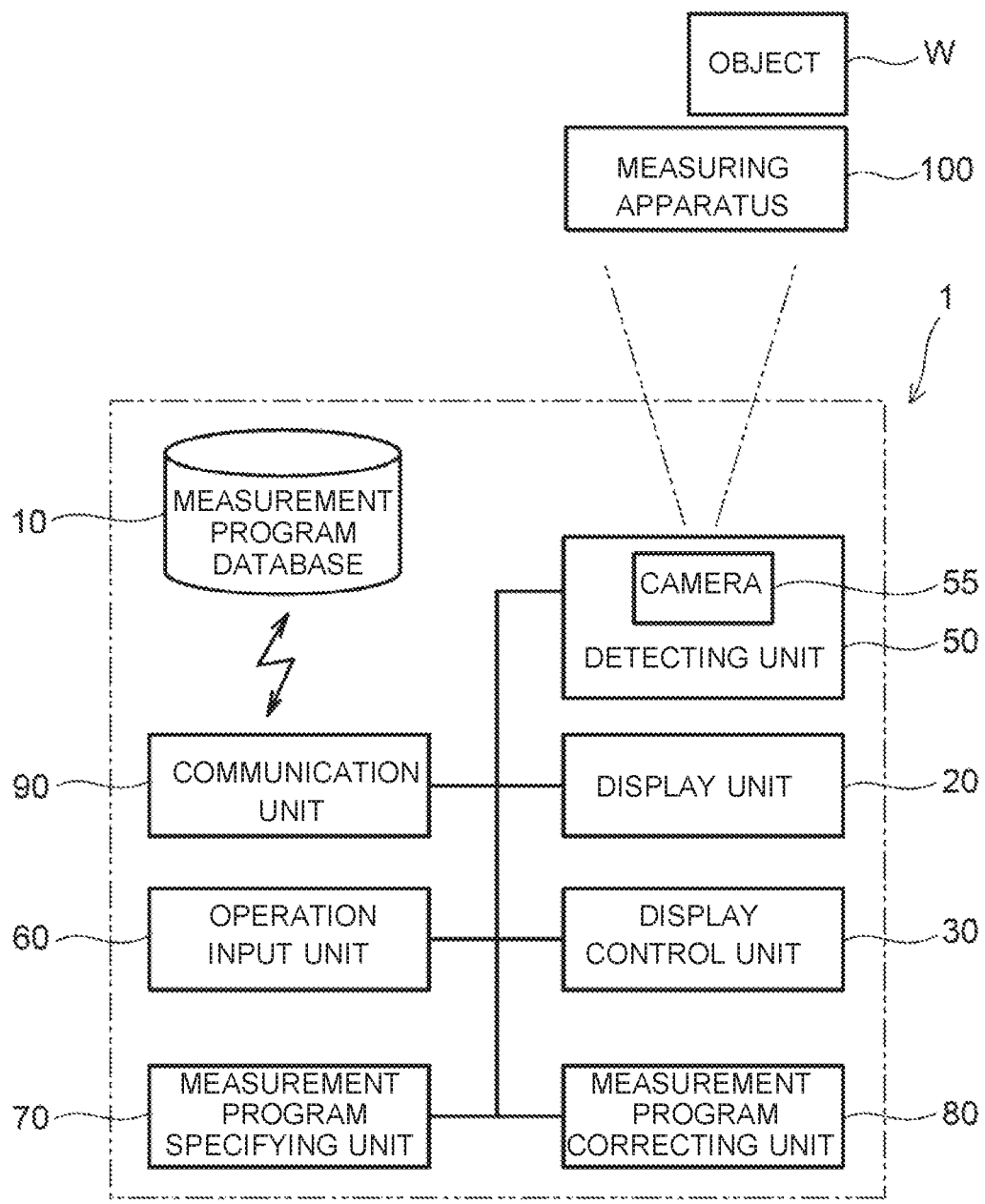
FIG. 2 is a block diagram illustrating the configuration of the measurement program selection assisting apparatus according to the first embodiment.

FIG. 2 is a block diagram illustrating a configuration of the measurement program selection assisting apparatus according to the present embodiment.

The measurement program selection assisting apparatus 1 according to the present embodiment is an apparatus that assists the operator P in selecting a measurement program (part program) used in the measuring apparatus 100 that measures the object W. In the present embodiment, a three-dimensional measuring apparatus is used as the measuring apparatus 100.

The three-dimensional measuring apparatus includes a measurement head 110 provided with a probe 111 for specifying a detection position of an object W, and a moving mechanism 120 for moving the measurement head 110. A computer system (not shown) may be connected to the three-dimensional measuring apparatus. The computer system executes necessary data processing to calculate three-dimensional coordinates and the like of the object W.

The object W is placed on the stage 112. The moving mechanism 120 for moving the measurement head 110 is provided on the stage 112. The moving mechanism 120 includes an X-axis guide 121, a Y-axis guide 122, and a Z-axis guide 123. In the present embodiment, the X-axis direction is one direction along the surface of the stage 112. The Y-axis direction is a direction orthogonal to the X-axis direction in a direction along the surface of the stage 112. The Z-axis direction is a direction orthogonal to the X-axis direction and the Y-axis direction. The Z-axis direction is also referred to as the vertical direction. The X-axis direction and the Y-axis direction are also referred to as horizontal directions.

In the present embodiment, the Z-axis guide 123 for moving the measurement head 110 in the Z-axis direction is provided so as to be movable in the X-axis direction by the X-axis guide 121. The X-axis guide 121 is provided so as to be movable in the Y-axis direction by the Y-axis guide 122. The measurement head 110 can be moved to a predetermined position in the three axial directions of XYZ by a combination of the movement of the X-axis guide 121, the Y-axis guide 122, and the Z-axis guide 123.

The measurement head 110 is provided with the probe 111 for specifying a detection position of the object W. The probe 111 may be a contact type or a non-contact type. In the probe 111 of the contact type, the measuring element 111*a* provided at the tip end of the probe 111 is brought into contact with the detection position of the object W to perform coordinate detection. In the non-contact type probe 111 detects coordinates of a position irradiated with the laser beam by irradiating, for example, the laser beam to the detection position of the object W and receiving the reflected light.

The measurement program selection assisting apparatus 1 according to the present embodiment assists the operator P in selecting a measurement program suitable for the object W when the operator P measures the object W using the measuring apparatus 100.

The measurement program selection assisting apparatus 1 includes a measurement program database 10, a display unit 20, and a display control unit 30. The measurement program database 10 stores the measurement program related to measurement of the object W and superimposed display information corresponding to the three-dimensional shape of the object W in association with each other. The superimposed display information includes various types of information related to the measurement of the object W, such as a three-dimensional model of the object W, a measurement path in a measurement program, and the like.

The display unit 20 is a unit capable of displaying a mixed reality (MR) that displays information defined in the virtual space by superimposing the information on the real space. As the display unit 20, a flat display or a head-up display is used. In the present embodiment, it is preferable to use a head-mounted display as the display unit 20. As a result, the operator P can refer to various types of information such as graphics, character information, and moving images on the virtual space displayed superimposed on the real space while obtaining a sense of immersion.

The display control unit 30 acquires superimposed display information corresponding to the selected measurement program from the measurement program database 10, and performs control to cause the display unit 20 to display the acquired superimposed display information in a mixed reality. The superimposed display information is displayed to be superimposed on the real image of the real space, such as the object W, the measuring apparatus 100, the wall of the room in which the measuring apparatus 100 is placed, and the like.

The measurement program selection assisting apparatus 1 according to the present embodiment further includes a detecting unit 50, an operation input unit 60, a measurement program specifying unit 70, a measurement program correcting unit 80, and a communication unit 90.

The detecting unit 50 recognizes the shape of the object W. The detecting unit 50 comprises a camera 55. The camera 55 acquires an image of the object W, the measuring apparatus 100, or the like. When a head-mounted display is used as the display unit 20, the camera 55 is provided on the head-mounted display. As a result, it is possible to acquire an image of the periphery in accordance with the orientation of the head of the operator P.

The detecting unit 50 may include a three-dimensional sensor. The three-dimensional sensor can track and analyze the movement of the operator P, or can detect the distance (depth) to the object W to acquire three-dimensional point cloud data on the surface of the object W. The three-dimensional sensor may be provided together with the camera 55, or may be provided instead of the camera 55. The detecting unit 50 may include an acceleration sensor or a gyro sensor for detecting the movement of the operator. The detecting unit 50 may be provided on the head-mounted display or may be fixedly provided outside the measuring apparatus 100.

The operation input unit 60 accepts an operation for designating a measurement target position on the object W. That is, the operation input unit 60 receives, for example, the measurement target position of the object W instructed by the operator P, and sends the measurement target position to the measurement program database 10. Here, the operation input unit 60 may read a specific movement of the operator's hand and perform control based thereon (hand gesture control).

The measurement program database 10 stores a measurement program for measuring a measurement target position received by the operation input unit 60 and superimposed display information corresponding to the three-dimensional shape of the measurement target position in association with each other.

The measurement program specifying unit 70 refers to the measurement program database 10 for the shape of the object W recognized by the detecting unit 50, and specifies a measurement program corresponding to the object W. The display control unit 30 causes the display unit 20 to display the superimposed display information corresponding to the measurement program specified by the measurement program specifying unit 70 in a mixed reality.

The measurement program correcting unit 80 performs correction processing for shifting coordinates defined in the measurement program. In the measurement program database 10, arrangement information for measurement indicating the position and orientation of the object W suitable for measuring the object W by the measurement program is stored in advance in association with the measurement program of the object W.

Then, when the position and orientation of the object W are acquired by the detecting unit 50, the measurement program correcting unit 80 calculates an error of the position and orientation of the object W acquired by the detecting unit 50 from the arrangement information for measurement corresponding to the measurement program specified by the measurement program specifying unit 70. Further, the measurement program correcting unit 80 performs correction (rotation or translation of coordinates) so as to shift the coordinates defined in the measurement program by the calculated error.

The communication unit 90 is an interface for inputting and outputting information to and from the outside. When the measurement program database 10 is connected to the network, the communication unit 90 inputs and outputs information to and from the measurement program database 10 via the network by wireless communication or wired communication.

In the measurement program selection assisting apparatus 1, superimposed display information corresponding to the three-dimensional shape of the object W to be measured is stored in the measurement program database 10. In addition, superimposed display information corresponding to the measurement program is superimposed on the real space and is displayed in a mixed reality on the display unit 20. Therefore, the operator P can visually determine whether or not the selected measurement program conforms to the object W to be measured by the mixed reality display displayed on the display unit 20. In particular, since the image of the three-dimensional model of the object W or the measurement path related to the measurement is superimposed on the real image of the object W or the measuring apparatus 100, the operator P can confirm the suitability of the selected measurement program while comparing the image of the real space with the superimposed display information, and can easily select the measurement program suitable for the object W.

[Operation of Measurement Program Selection Assisting Apparatus]

Next, the operation of the measurement program selection assisting apparatus 1 according to the present embodiment will be described.

Figure 3:
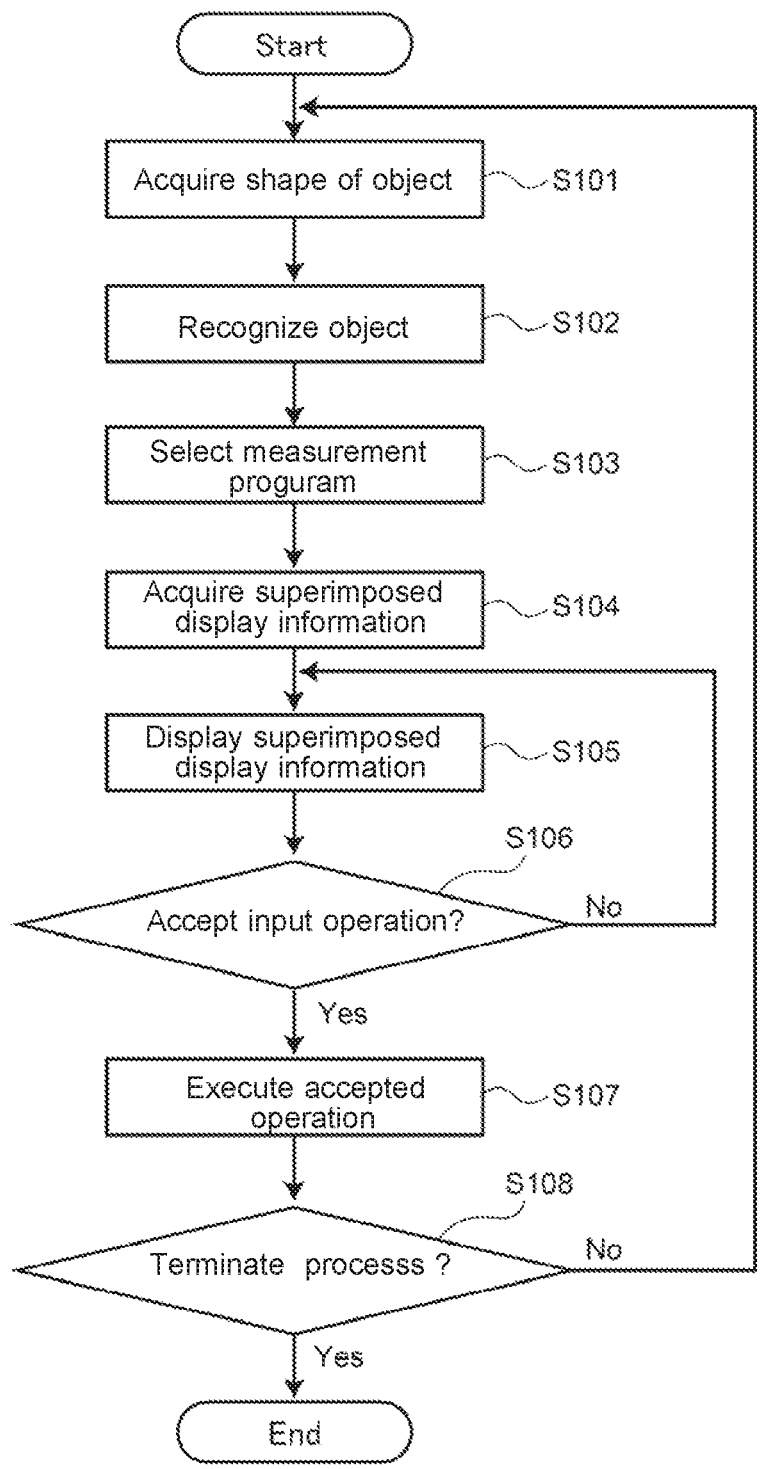
FIG. 3 is a flowchart illustrating the operation of the measurement program selection assisting apparatus according to the first embodiment.

FIG. 3 is a flowchart illustrating the operation of the measurement program selection assisting apparatus according to the present embodiment.

In the description of the operation, the configurations and reference numerals not shown in the flowchart of FIG. 3 shall refer to FIGS. 1 and 2.

First, as shown in step S101, the shape of the object W is acquired. The operator P places the object W on a predetermined position of the stage 112. The object W is fixed to the stage 112 by a jig as necessary. The measurement program selection assisting apparatus 1 acquires the shape of the object W placed on the stage 112 by the camera 55 or the three-dimensional sensor of the detecting unit 50.

Next, as shown in step S102, the object W is recognized. The recognition of the object W is performed on the basis of an image acquired by the camera 55 or information (point group data or the like) detected by, for example, the three-dimensional sensor of the detecting unit 50.

Next, as shown in the step S103, a measurement program is selected. The measurement program specifying unit 70 makes an inquiry to the measurement program database 10 based on the shapes of the object W recognized in the preceding step S102, and specifies the measurement program corresponding to the recognized object W. When there are a plurality of measurement programs as selection candidates, the measurement program may be selected based on an instruction from the operator P.

Next, as shown in step S104, the superimposed display information is acquired. The display control unit 30 acquires superimposed display information corresponding to the measurement program selected in the previous step S103 from the measurement program database 10. When the measurement program database 10 is connected to the network, the superimposed display information is acquired via the communication unit 90. The superimposed display information includes a three-dimensional model of the object W and information on a measurement path by the selected measurement program.

Next, as shown in step S105, the superimposed display information is displayed in a mixed reality. The display control unit 30 causes the display unit 20 to superimposingly display the superimposed display information acquired in the preceding step S104 on the object W or the like, in a mixed reality manner. As a result, the operator P can visually determine whether the selected measurement program conforms to the measurement of the object W with reference to the mixed reality display displayed on the display unit 20.

Next, as shown in step S106, it is determined whether or not an operational input has been received. The operator P refers to the mixed reality display displayed on the display unit 20, and makes a decision as to whether to execute the measurement by the selected measurement program, or to select another measurement program, or to cancel the measurement. Then, the operation input unit 60 accepts the operation by the operator P. When the operation is accepted, the accepted operation is executed as shown in step S107. If no operation has been accepted, the process returns to step S105.

For example, when the operator P performs the operation of executing the measurement with the selected measurement program and the operation input unit 60 receives the operation, the operator P executes the measurement of the object W with the selected measurement program. When the operator P instructs the measurement target position of the object W, the operation input unit 60 accepts the measurement target position, and executes a process of storing a measurement program for measuring the measurement target position and superimposed display information corresponding to the three-dimensional shape of the measurement target position in association with each other.

Next, as shown in step S108, it is determined whether or not to terminate the process. When the processing is to be terminated, the operation of the measurement program selection assisting apparatus 1 is terminated, and when the processing is to be continued, the processing returns to step S101, and the subsequent processing is repeated.

Measurement Program Selection Assist Program

At least part of each step of the flow chart of the operation of the measurement program selection assisting apparatus 1 shown in FIG. 3 may be comprised of a program to be implemented by the computer (a measurement program selection assist program). For example, the selection assist program includes a recognition process (step S101 to step S102) for recognizing the object W, a selection process (step S103) for selecting the measurement program based on the shape of the recognized object W, a superimposed display information obtaining process (step S104) for obtaining superimposed display information corresponding to the selected measurement program, and a display process (step S105) for displaying the obtained superimposed display information in a mixed reality.

[Specific Applications]

Next, a specific application example of the measurement program selection assisting apparatus 1 will be described.

FIGS. 4 to 8 are schematic diagrams for explaining a specific application example of the measurement program selection assisting apparatus according to the present embodiment.

Figure 4:
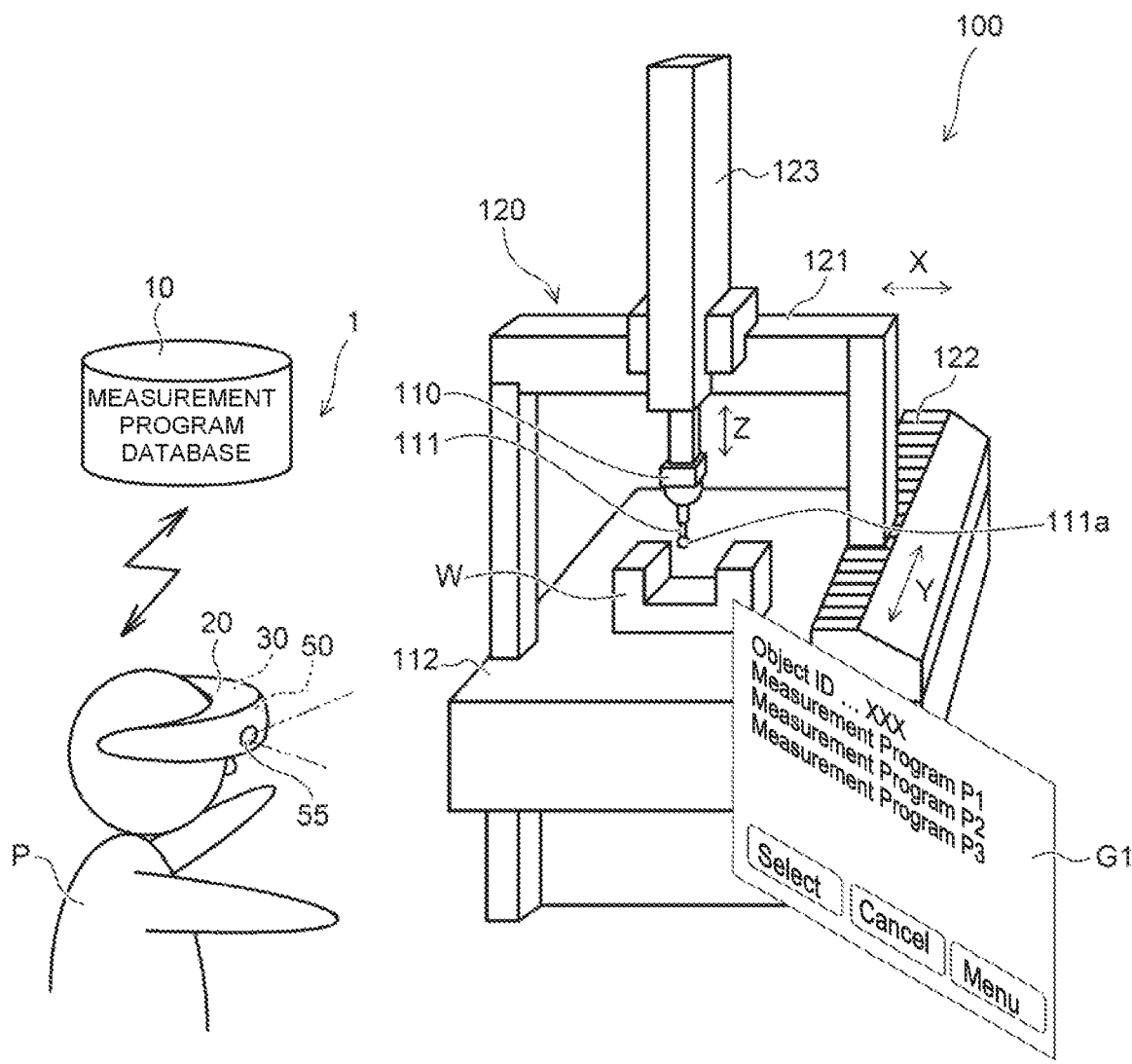
FIG. 4 is a schematic diagram showing a display example of a measurement program in the measurement program selection assisting apparatus according to the first embodiment.

FIG. 4 shows a display example of the measurement program.

The operator P is equipped with a head-mounted display. When the object W placed on the stage 112 of the measuring apparatus 100 is recognized by the camera 55 or the like of the detecting unit 50 provided in the head-mounted display, a measurement program related to measurement of the object W is read out from the measurement program database 10 based on the recognition result.

On the display unit 20, a list of measurement programs read out from the measurement program database 10 is displayed in a mixed reality. For example, the image G1 includes identification information (ID) of the object W and a list of a plurality of measurement programs (e.g., measurement programs P1, P2, and P3). This image G1 is displayed so as to float up to a predetermined position in the real space real image viewed by the operator P through the head-mounted display. For example, the image G1 is displayed in the vicinity of the real image of the measuring apparatus 100.

Icons of various processes may be displayed on the image G1. When the operator P performs an operation of, for example, tapping a desired icon of the image G1 with a finger, the operation is accepted by the operation input unit 60, and a process corresponding to the tapped icon is executed.

Figure 5:
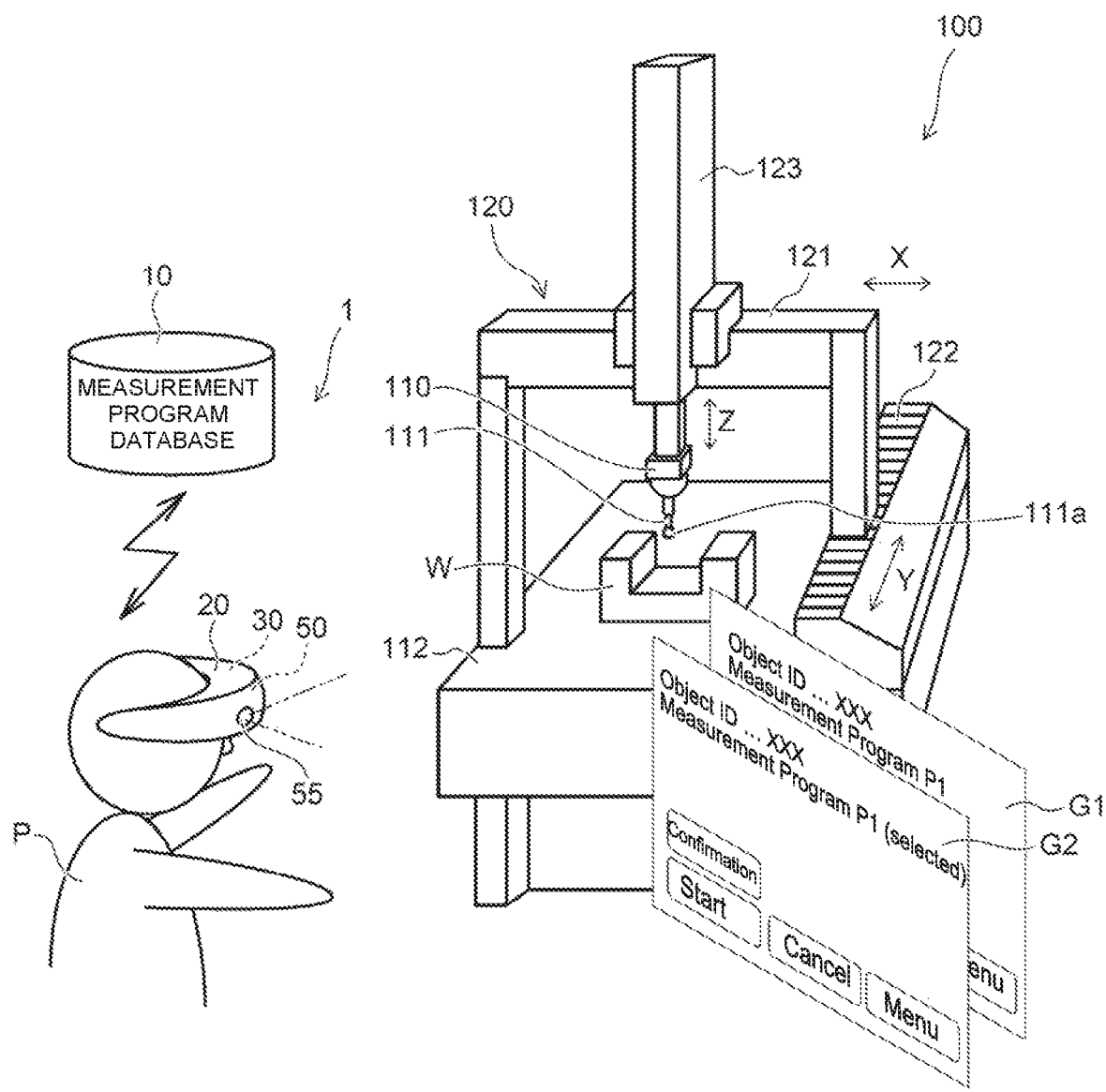
FIG. 5 is a schematic diagram showing a display example of a selected measurement program in the measurement program selection assisting apparatus according to the first embodiment.

FIG. 5 shows a display example of the selected measurement program.

When a predetermined measurement program is selected from the list in shown the image G1, the image G2 is displayed on the display unit 20. For example, the image G2 is displayed so as to be superimposed on the image G1. The operator P can confirm the selected measurement program by referring to the display of the image G2. In the example shown in FIG. 5, the measurement program P1 is selected. When the "cancel" icon is selected in the image G2, the display of the image G2 disappears, and the display returns to the display of the image G1. This makes it possible to select another measurement program.

If the selected measurement program P1 is acceptable, the "confirmation" or "start" icon is selected. When the "start" icon is selected, measurement by the measurement program P1 is started. On the other hand, when the "confirmation" icon is selected, the confirmation of the information on the measurement program can be performed.

Figure 6:
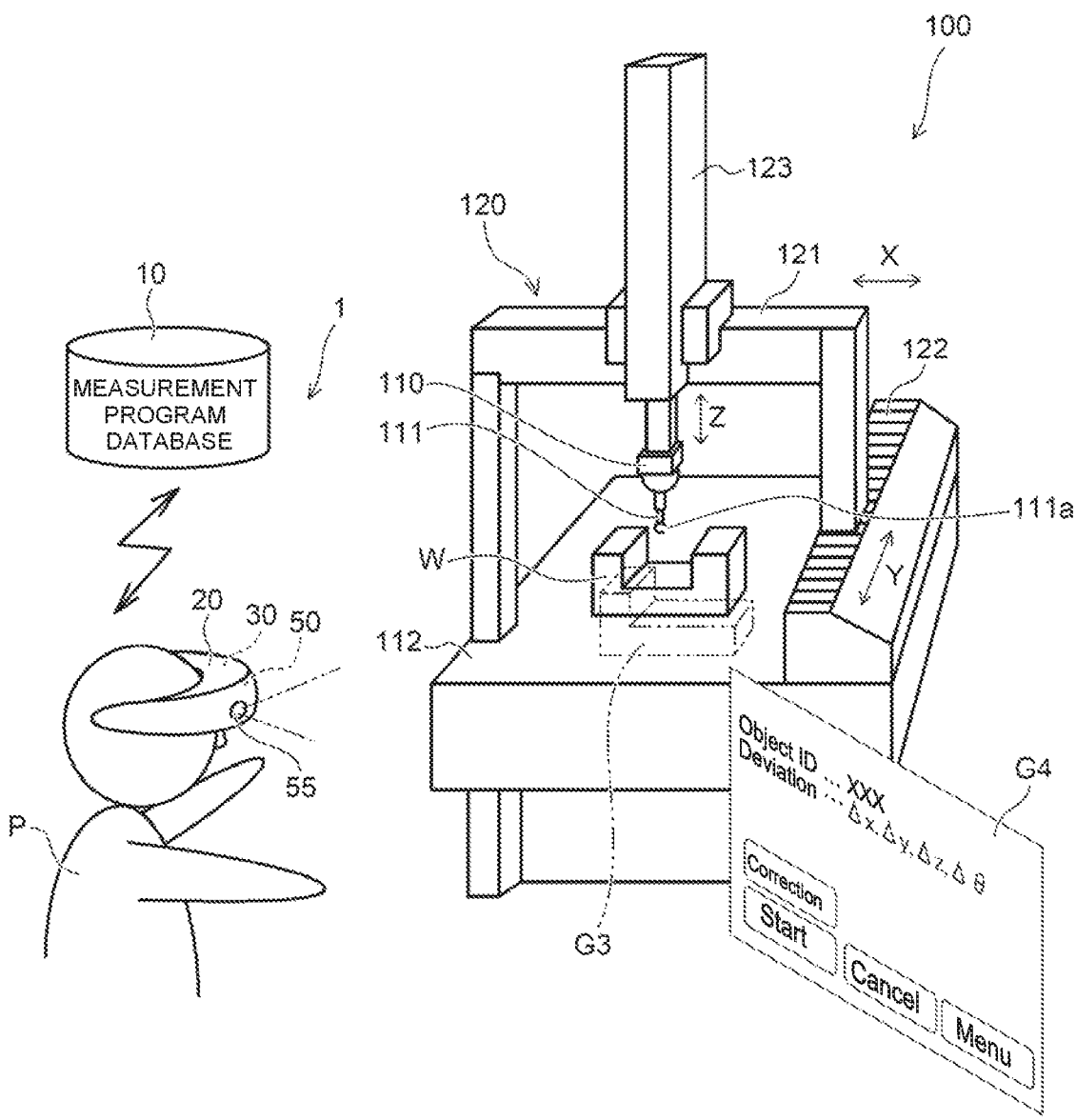
FIG. 6 is a schematic diagram showing a display example of a three-dimensional model in the measurement program selection assisting apparatus according to the first embodiment.

FIG. 6 shows a display example of a three-dimensional model.

That is, the display of the image G3 of the three-dimensional model shown in FIG. 6 can be cited as one example of the information on the selected measurement program. The image G3 of the three-dimensional model is acquired as superimposed display information of the object W placed on the stage 112. The image G3 of the three-dimensional model is displayed superimposed on the real image of the object W. The image G3 of the three-dimensional model is information defined in the virtual space.

The image G3 of the three-dimensional model displayed on the display unit 20 is displayed by matching the coordinates of the real space detected by the detecting unit 50 with the coordinates of the virtual space. That is, in the image G3 of the three-dimensional model, coordinates obtained from the arrangement information for measurement indicating the position and orientation of the object W suitable for measurement by the measurement program P1 are displayed in accordance with the coordinates of the real space.

Therefore, for example, when the position and orientation of the object W placed on the stage 112 coincide with the position and orientation of the object W suitable for measurement by the measurement program P1, the real image of the object W and the image G3 of the three-dimensional model are displayed without any positional deviation. On the other hand, when the position and orientation of the object W placed on the stage 112 and the position and orientation of the object W suitable for measurement by the measurement program P1 are deviated, the real image of the object W and the image G3 of the three-dimensional model are displayed so as to be deviated from each other. The deviation between the position and orientation of the object W and the position and orientation of the image G3 of the three-dimensional model may be displayed as the image G4 in a mixed reality.

Here, when the position and orientation of the object W placed on the stage 112 and the position and orientation of the object W suitable for measurement by the measurement program P1 are deviated, the deviation amount (error) may be calculated by the measurement program correcting unit 80, and the coordinates specified in the measurement program may be corrected so as to be shifted by the calculated error. For example, the correction is executed by the operator P selecting the "correction" icon of the image G4. When this correction is performed, the display position of the image G3 of the three-dimensional model coincides with the position of the real image of the object W.

The shape of the object W placed on the stage 112 may differ from the shape of the image G3 of the three-dimensional model defined by the measurement program P1. The operator P can visually understand the difference between the shapes of the real image of the object W and the image G3 of the three-dimensional model by the mixed reality display. If it is necessary to change the measurement position due to the difference in the shape of both, measurement position can be changed according to the instructions of the operator P.

Figure 7:
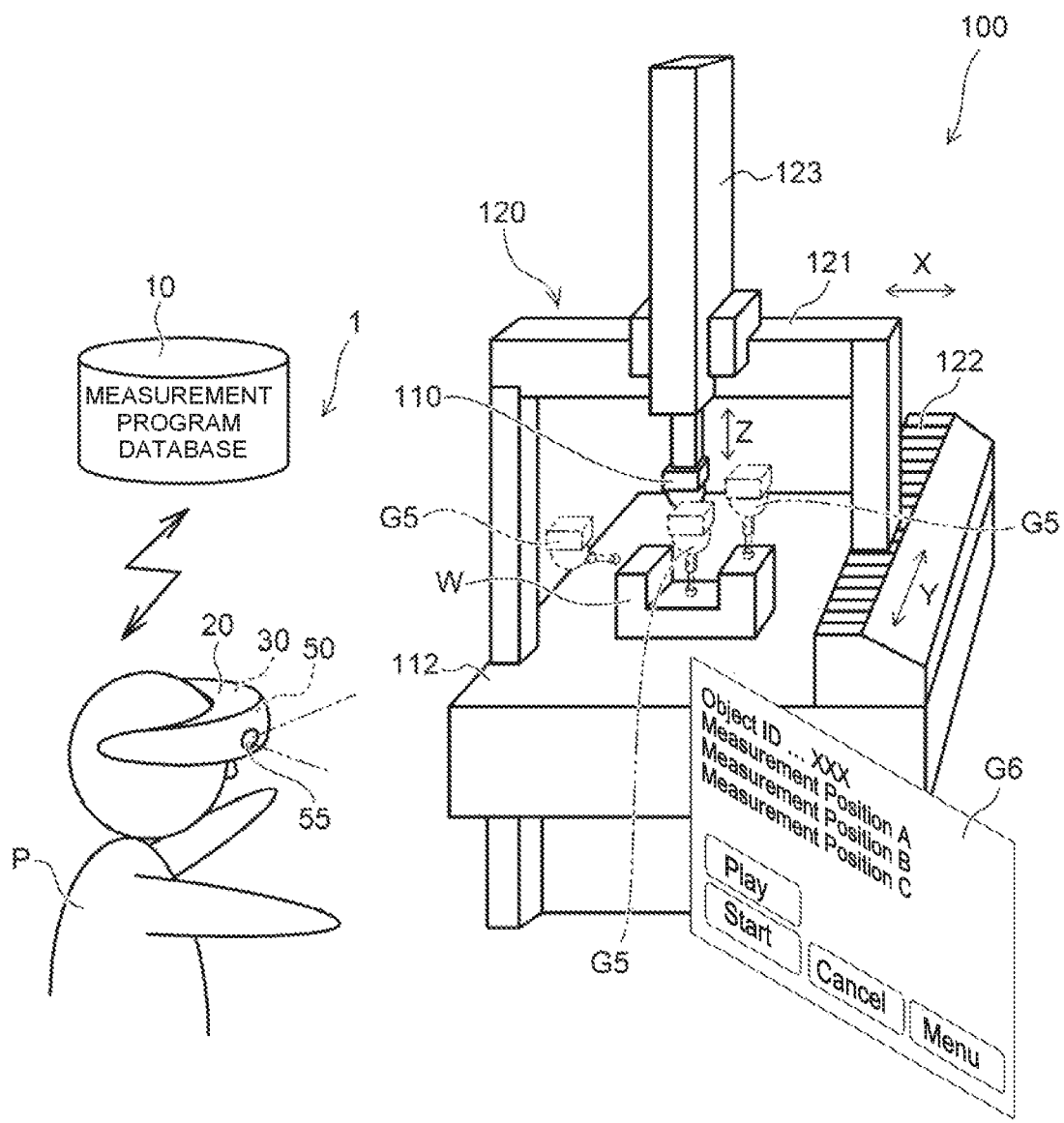
FIG. 7 is a schematic diagram showing a display example of a measurement path in the measurement program selection assisting apparatus according to the first embodiment.

FIG. 7 shows a display example of the measurement path.

Another example of the information relating to the selected measurement program is the display of the measurement path image G5 shown in FIG. 7. The measurement path image G5 is an example of a motion prediction display indicating the motion of the measuring apparatus 100 when the selected measurement program P1 (part program) is executed. The measurement path image G5 is acquired as superimposed display information of the object W placed on the stage 112. The measurement path image G5 is displayed as an image indicating the position and orientation of the measurement head 110 with the probe 111 so as to be superimposed on the real image of the object W.

The measurement path image G5 is a graphic image corresponding to the actual probe 111 and the measurement head 110. The measurement path image G5 may be displayed as a moving image so as to move along the measurement order of the object W, or may be displayed as a still image indicating the state of measurement at a desired measurement position. In the case of displaying as a still image, a plurality of still images may be displayed at positions corresponding to the path of movement. Further, the measurement path image G5 may be displayed as a line, a point, an arrow indicating the path of the probe (a line of all the paths, a line extending in order from the start point, a moving point or the like).

The operator P can visually understand the position and the operation of the probe 111 and the measurement head 110 when actually performing measurement on the object W placed on the stage 112 by referring to the measurement path image G5 displayed in a mixed reality on the display unit 20. By referring to the image G5, it is possible to determine whether or not the measurement head 110 interferes with the object W.

In addition, the image G6 indicating the information of the measurement position in the measurement path may be displayed in a mixed reality. In this image G6, icons of "play" and "edit" of the measurement path are displayed.

When the "play" icon is selected by the operator P, the measurement path image G5 is played and displayed in the order of measurement. When the "edit" icon is selected as necessary, editing such as addition, deletion, and change of the measurement order of the measurement part can be performed.

In addition, the measurement program selection assisting apparatus 1 may calculate whether or not interference occurs in the measurement path based on the three-dimensional shape (three-dimensional coordinates) of the object W detected by the detecting unit 50 and the movement path (motion prediction display) of the probe 111 and the measurement head 110, and display attention information on the display unit 20. That is, it is preferable that the measurement program selection assisting apparatus 1 evaluates the risk of interference occurring between the object W and the measuring apparatus 100 when the measurement program is executed, and gives a warning when there is interference or the risk. More specifically, it is preferable that the motion prediction display is virtually moved, and a state of how much the probe 111 or the measurement head 110 interferes at the interfering position is displayed as caution information, and a warning is given. For example, a warning may be given by pointing to a position where interference occurs by an arrow or the like, or by displaying characters or illustrations. In addition, warning may be given by sound, vibration, shock, electrical stimulation, or the like. These warnings may also be used in combination.

Figure 8:
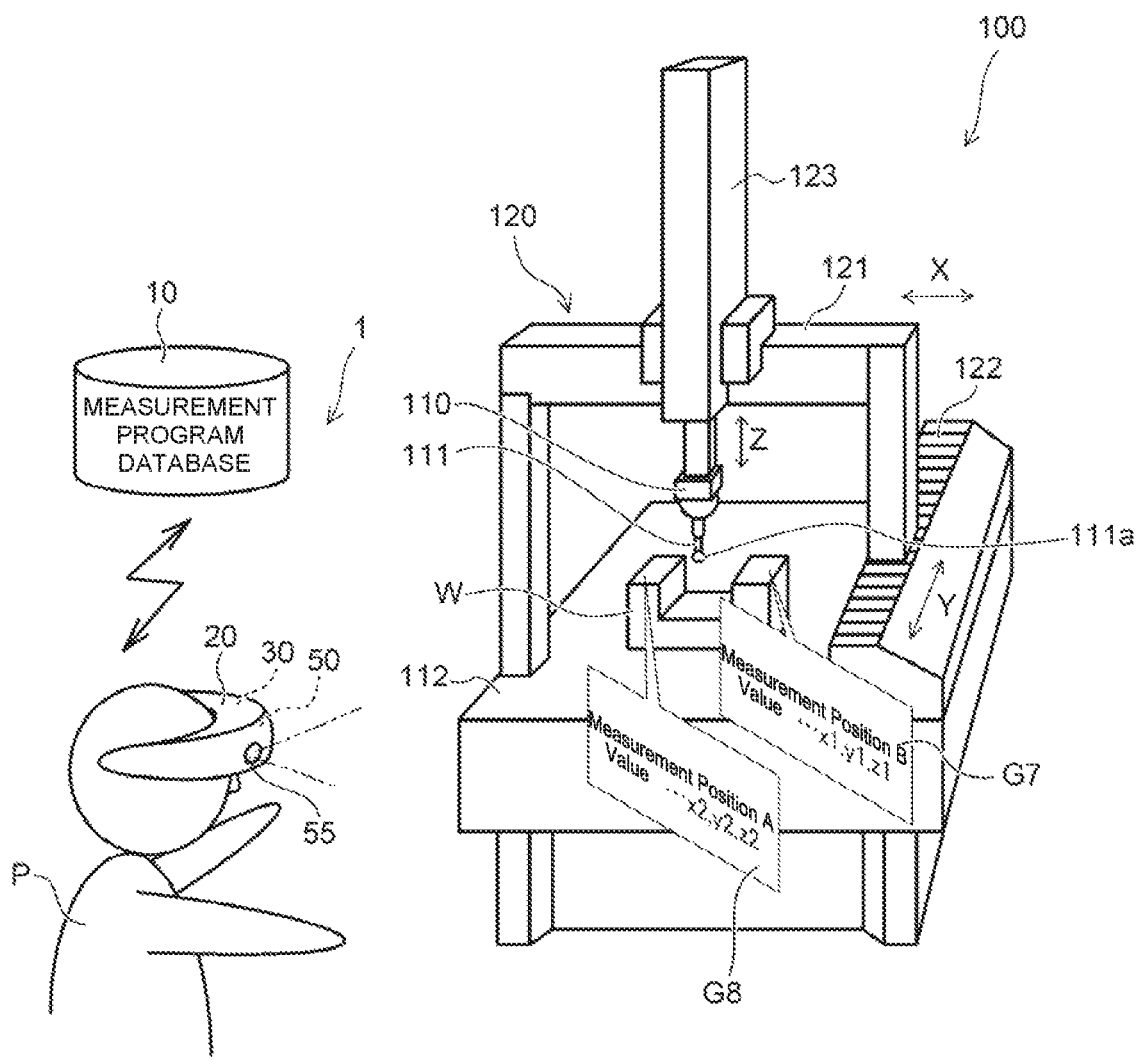
FIG. 8 is a schematic diagram showing a display example of measurement results in the measurement program selection assisting apparatus according to the first embodiment.

FIG. 8 shows a display example of the measurement result.

When the measurement of the object W is performed, the images G7 and G8 of the measurement values at the respective measurement points are displayed in a mixed reality on the display unit 20. The images G7 and G8 may be displayed together with a marker indicating a measurement position of the object W. In addition, an image indicating the past measurement result of the object W, for example, the previous measurement, may be displayed. As a result, the operator P can perform the measurement while referring to the past measurement results of the object W displayed on the display unit 20.

As described above, according to the first embodiment, the operator P can visually confirm whether or not the measurement program is appropriate by referring to the image displayed in a mixed reality superimposed on the real image of the object W or the like, and can accurately and easily select the measurement program suitable for the object W.

Second Embodiment

Figure 9:
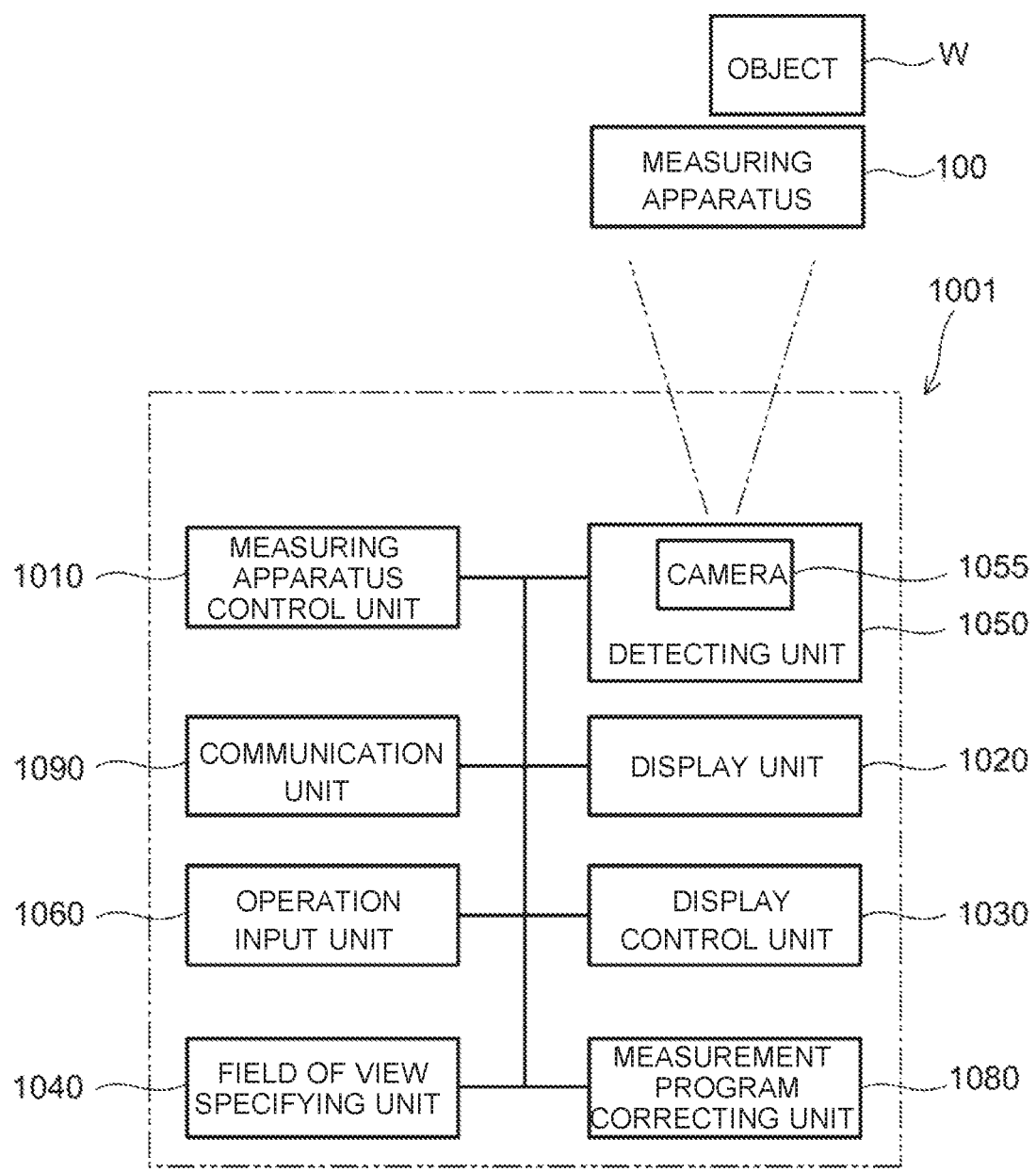
FIG. 9 is a block diagram illustrating a configuration of a measurement control apparatus according to the second embodiment.

FIG. 9 is a block diagram illustrating a configuration of a measurement control apparatus according to the second embodiment. The measurement control apparatus 1001 according to the present embodiment provides a more enhanced function for reducing the risk of interference between the object W and the measuring apparatus 100 when the measurement program is executed. The measurement control apparatus 1001 is an apparatus for controlling the operation of the measuring apparatus 100, and may be provided as a part of the measuring apparatus 100. The configuration of the measuring apparatus 100 is the same as that of the first embodiment described above, and a description thereof will be omitted.

The measurement control apparatus 1001 includes a measuring apparatus control unit 1010, a display unit 1020, a display control unit 1030, and a field of view specifying unit 1040. The measuring apparatus control unit 1010 performs measurement by controlling the measurement head 110 and the moving mechanism 120 of the measuring apparatus 100 according to a measurement program related to the measurement of the object W.

The display unit 1020 is a unit capable of displaying a mixed reality (MR) that is superimposed on the real space and displays information defined in the virtual space. A flat display or a head-up display is used as the display unit 1020. In the present embodiment, it is preferable to use a head-mounted display as the display unit 1020. As a result, the operator P can refer to various types of information such as graphics, character information, and moving images on the virtual space displayed superimposed on the real space while obtaining a sense of immersion.

The display control unit 1030 performs control to cause the display unit 1020 to display the superimposed display information corresponding to the measurement program to be executed in a mixed reality. The superimposed display information in the present embodiment includes at least information indicating a moving path of the measuring apparatus 100 when the measurement program is executed. As a specific example of such superimposed display information, a so-called motion prediction display may be used in which the movement path of the probe 111 and the measurement head 110 of the measuring apparatus 100 when the measurement program is executed are displayed in time series. The motion prediction display may be displayed as a moving image so as to move along the measurement order of the object W, or may be displayed as a still image indicating the state of measurement at a desired measurement position. In the case of displaying as a still image, a plurality of still images may be displayed at positions corresponding to the path of movement. In addition, the motion prediction display may be a graphic such as a line, a point, an arrow indicating the trajectory of the probe (a line for all paths, a line extending in order from the start point, a moving point) or the like. In addition, as the superimposed display information, the measuring apparatus 100, the wall of the room in which the measuring apparatus 100 is placed, and the like may be superimposingly displayed on the real image of the real space.

The field of view specifying unit 1040 specifies the field of view of the operator P. The method by which the field of view specifying unit 1040 specifies the field of view of the operator P is arbitrary. The field of view specifying unit 1040 may specify the field of view of the operator P using, for example, detection information from a position/orientation sensor provided in the head-mounted display. Alternatively, the gaze direction of the operator P may be tracked by a camera or the like to specify the field of view of the operator P.

The measurement control apparatus 1001 according to the present embodiment further includes a detecting unit 1050, an operation input unit 1060, a measurement program correcting unit 1080, and a communication unit 1090.

The detecting unit 1050 recognizes the shape of the object W. The detecting unit 1050 includes a camera 1055. The camera 1055 acquires an image of the object W, the measuring apparatus 100, or the like. When a head-mounted display is used as the display unit 1020, a camera 1055 is provided in the head-mounted display. As a result, it is possible to acquire an image of the periphery in accordance with the orientation of the head of the operator P.

The detecting unit 1050 may include a three-dimensional sensor. The three-dimensional sensor can track and analyze the movement of the operator P, or can detect the distance (depth) to the object W to acquire three-dimensional point cloud data on the surface of the object W. The three-dimensional sensor may be provided together with the camera 1055, or may be provided instead of the camera 1055. The detecting unit 1050 may include an acceleration sensor or a gyro sensor for detecting the movement of the operator. The detecting unit 1050 may be provided on the head-mounted display or may be fixedly provided outside the measuring apparatus 100.

The operation input unit 1060 receives an operation for specifying a measurement target position on the object W. That is, the operation input unit 1060 receives, for example, a measurement target position of the object W instructed by the operator P, and sends the measurement target position to the measurement program database 10. Here, the operation input unit 1060 may read and control a specific movement of the operator's hand (hand gesture control).

As described above, the measurement control apparatus 1001 according to the present embodiment includes many components common to the measurement program selection assisting apparatus 1 described in the first embodiment. Therefore, the measurement control apparatus 1001 may be realized using the same hardware as that of the measurement program selection assisting apparatus 1. That is, the measurement program selection assisting apparatus 1 according to the first embodiment and the measurement control apparatus 1001 according to the second embodiment may be realized by a set of hardware.

[Operation of the Measurement Control Apparatus]

Next, the operation of the measurement control apparatus 1001 according to the present embodiment will be described.

Figure 10:
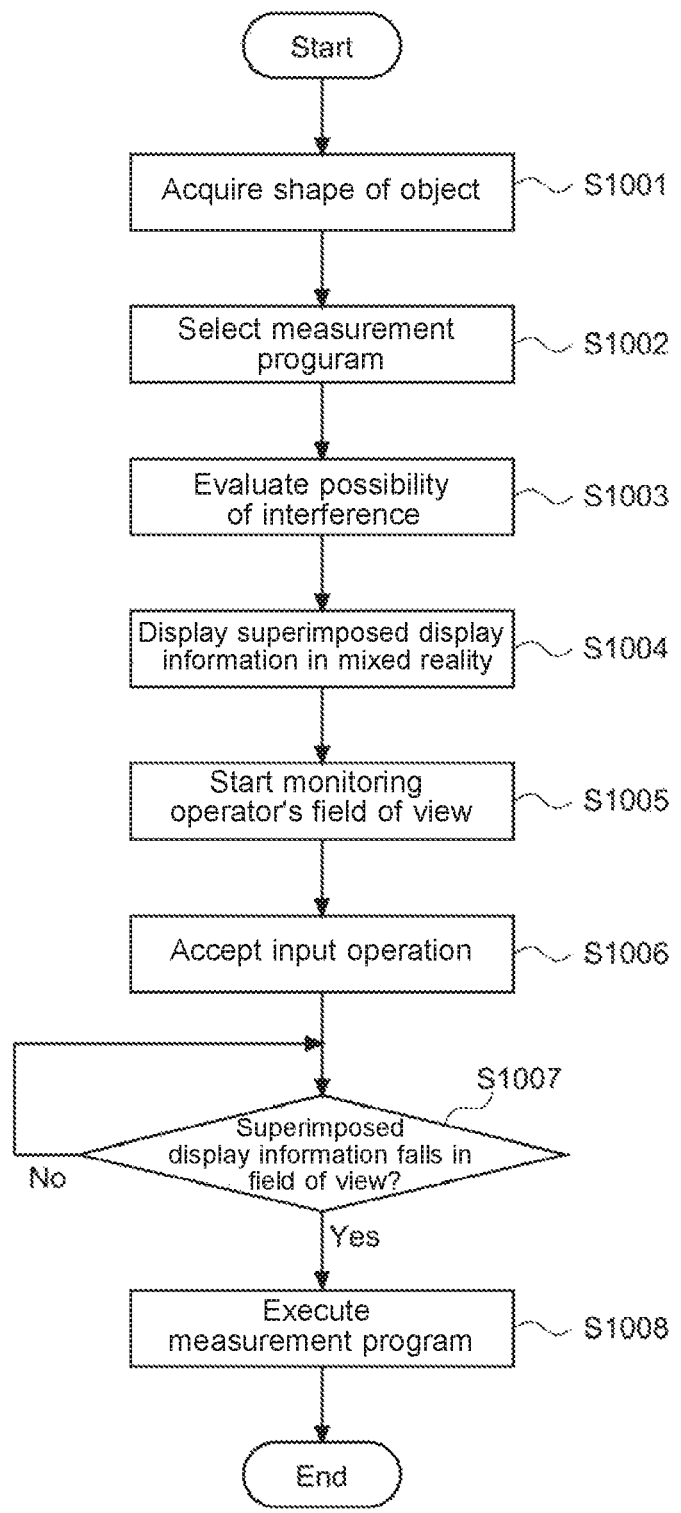
FIG. 10 is a flowchart illustrating the operation of the measurement control apparatus according to the second embodiment.

FIG. 10 is a flowchart illustrating the operation of the measurement control apparatus 1001 according to the present embodiment.

First, as shown in step S1001, the shape of the object W is acquired. The operator P places the object W on a predetermined position of the stage 112. The object W is fixed to the stage 112 by a jig as necessary. The measurement control apparatus 1001 acquires the shape of the object W placed on the stage 112 by the camera 1055 or the three-dimensional sensor of the detecting unit 1050. At this time, the shape of the object W is acquired as information (point cloud data or the like) detected by, for example, a three-dimensional sensor of the detecting unit 1050.

Next, in step S1002, the measurement program is selected. The measurement program may be selected by the measurement program selection assisting apparatus 1 described in the first embodiment, or may be selected by an instruction of the operator P.

Next, the measurement control apparatus 1001 evaluates the possibility that the object W interferes with the measuring apparatus 100 when the measurement program is executed based on the selected measurement program and the shape of the object W acquired by the detecting unit 1050 (step S1003).

Next, in step S1004, the display control unit 1030 causes the display unit 1020 to display the superimposed display information corresponding to the measurement program selected in the previous step S1002 on the display unit 1020, in a mixed reality manner. As described above, the superimposed display information in the present embodiment includes at least information indicating the moving path of the measuring apparatus 100 when the measurement programs are executed, warning information indicating a position where there is a high possibility of interfering (the possibility of interfering is equal to or greater than a predetermined threshold) as a result of the evaluations in the S1003 of steps, and the like. Thereby, the operator P can visually confirm the possibility that the interference between the measuring apparatus 100 and the object W occurs when the selected measurement program is executed by referring to the mixed reality display displayed on the display unit 1020. In addition to displaying the superimposed display information, warnings may be given by other methods, such as voice, vibration, shock, electrical stimulation, etc., if there is a position where there is a high possibility of interference.

Figure 11A:
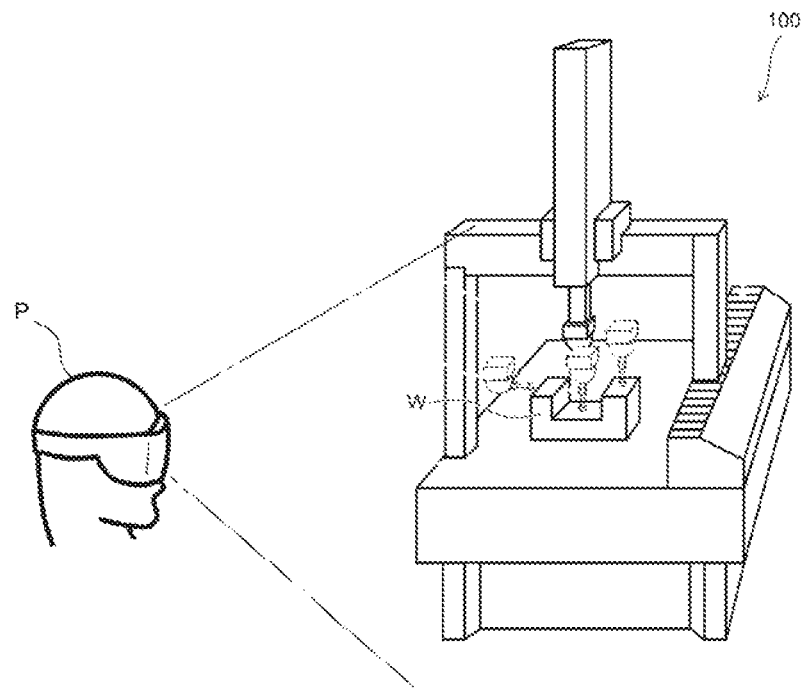
FIGS. 11A and 11B are schematic diagrams showing a state in which the field of view the operator is monitored by the field of view specifying unit.
Figure 11B:
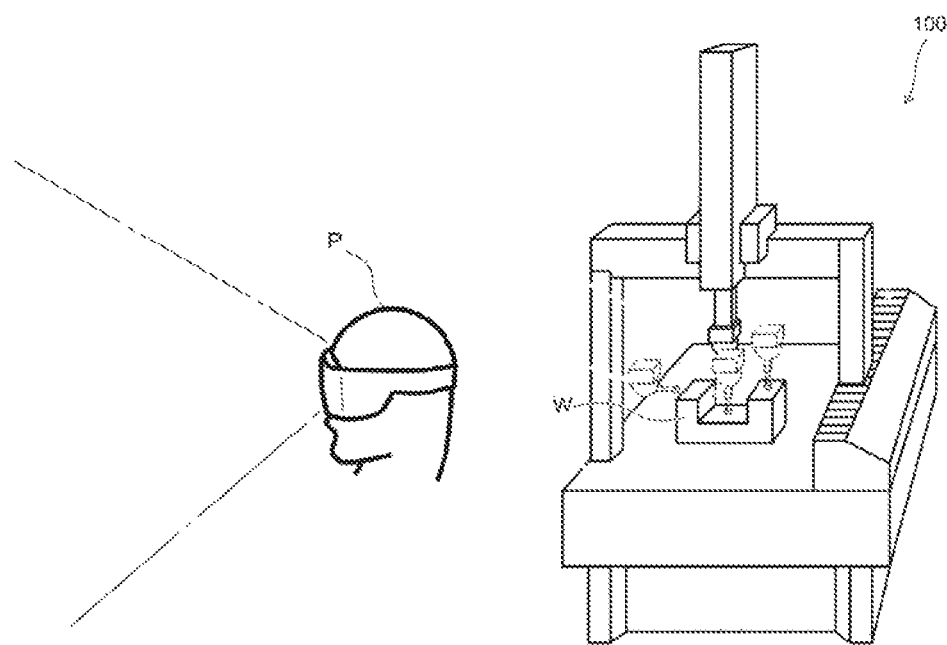

Subsequently, the field of view specifying unit 1040 starts to specify the field of view of the operator P. Then, as shown in FIGS. 11A and 11B, it is monitored whether or not the mixed reality display of the superimposed display information falls within the field of view of the operator P. When the mixed reality display of the superimposed display information falls within the field of view of the operator P, this fact is recorded (for example, in a storage unit such as a memory) (step S1005). FIG. 11A shows a state in which the mixed reality display of the superimposed display information falls within the field of view of the operator P. FIG. 11B shows a state in which the mixed reality display of the superimposed display information does not fall within the field of view of the operator P.

The operator P refers to the mixed reality display displayed on the display unit 1020 in step S1004, and makes a determination as to whether to execute the measurement by the selected measurement program, select another measurement program, or cancel the measurement. When the measurement control apparatus 1001 receives an operation input instructing the execution of the measurement program by the operator P (step S1006), the measurement control apparatus 1001 determines whether the mixed reality display of the superimposed display information falls within the field of view of the operator P (step S1007).

When the fact that the mixed reality display of the superimposed display information falls within the field of view of the operator P is not recorded (step S1007; No), the measuring apparatus control unit 1010 of the measurement control apparatus 1001 does not execute the movement of the measuring apparatus 100 by the measurement program, and returns the process to the step S1007. Thereafter, until the field of view specifying unit 1040 can confirm that the mixed reality display of the superimposed display information falls within the field of view of the operator P, the movement of the measuring apparatus 100 by the measurement program is not executed. It should be noted that "the movement of the measuring apparatus 100 by the measurement program is not executed" may mean that the entire measurement program is not executed. Alternatively, the procedures involving physical movement of the measurement head, the probe, or the like in the measuring apparatus 100 may not be executed in the measurement program, and other procedures may be allowed to be executed.

On the other hand, when it is recorded that the mixed reality display of the superimposed display information falls within the field of view of the operator P (step S1007; YES), the measuring apparatus control unit 1010 of the measurement control apparatus 1001 executes the measurement of the object W by the selected measurement program (step S1008), and the process ends.

With the above described configuration and operation, the measurement control apparatus according to the present embodiment does not allow physical movement of the measurement head, the probe, or the like in the measuring apparatus 100 unless the operator P visually confirms the information indicating the movement path of the measuring apparatus 100 in the case of executing the measurement program. Therefore, it is possible to prevent collision and interference between the probe or the like and the object W due to neglect of visual confirmation.

[Measurement Control Program]

At least part of each step in the flowchart of the operation of the measurement control apparatus 1001 shown in FIG. 10 may be comprised of a program to be executed by the computer (a measurement control program). For example, the measurement control program may include a recognition process (step S1001 to step S1002) for recognizing the object W, a selection process (step S1003) for selecting the measurement program, and a display process (step S1004) for displaying superimposed display information corresponding to the selected measurement program.

Modifications of the Embodiments

Although each embodiment has been described above, the present invention is not limited to these examples. For example, in the first embodiment described above, an example has been described in which the measurement program corresponding to the shape of the object W is selected, but the measurement program including the measurement position may be read out from the measurement program database 10 by designating the measurement position of the object W by a gesture of the operator P or the like. In addition, although a three-dimensional measuring apparatus has been described as an example of the measuring apparatus 100, the measuring apparatus 100 may be a measuring apparatus other than the three-dimensional measuring apparatus.

In each of the embodiments described above, a warning is given when there is interference or a risk of interference, but in addition to the warning, a restriction may be imposed on the execution of the measurement program. For example, when there is interference or a risk of interference, the movement of the measuring apparatus 100 by the measurement program may not be executed. Alternatively, the movement may be stopped when the measuring apparatus 100 is moved by the measurement program to a position in front of the interfering position by a predetermined moving distance. After the movement is stopped, the measurement program may be modified or the object W may be repositioned to perform subsequent measurements when the risk of interference is removed.

Further, in the second embodiment described above, the movement of the measuring apparatus is not started unless the mixed reality display of the superimposed display information falls within the field of view of the operator P, but in addition to the mixed reality display of the superimposed display information falling within the field of view of the operator P, other conditions (e.g., pressing a button, touching a screen, inputting a voice command, gesture, etc.) may be used as the conditions for starting the movement.

In addition, as long as the gist of the present invention is provided, a person skilled in the art may appropriately add, delete, or change the design of the constituent elements or appropriately combine the features of each embodiment with respect to each of the above-described embodiments, the above is included in the scope of the present invention.

What is claimed is:

1. A measurement control apparatus comprising:
a control unit that executes a selected measurement program to cause a measuring apparatus to perform measurement of an object by controlling movement of a probe or motion of a measurement head according to a measurement order specified in the measurement program;
a display unit capable of displaying information defined in a virtual space superimposed on the real space;
a display control unit that causes the display unit to display, as the superimposed display information, a motion prediction display indicating the motion of the measuring apparatus when the selected measuring program is executed; and
a detecting unit for acquiring a shape, a position and an orientation of the object,
wherein the control unit evaluates, based on the shape of the object acquired by the detecting unit and the selected measurement program, the possibility of interference between the object and the measuring apparatus when the measurement program is executed, and
wherein the display control unit causes the display unit to display where the possibility of interference occurs is more than a predetermined value as the superimposed display information in mixed reality.

2. The measurement control apparatus according to claim 1, wherein the motion prediction display includes a three-dimensional moving image.

3. The measurement control apparatus according to claim 1, wherein the motion prediction display includes a graphic showing a moving path of the probe included in the measuring apparatus.

4. The measurement control apparatus according to claim 1, further comprises a field of view specifying unit for specifying the field of view of the operator,
wherein the control unit controls the movement of the measuring apparatus based on the measurement program so as not to start unless the superimposed display information falls within the field of view of the operator specified by the field of view specifying unit.

* * * * *